United States Patent [19]
Mayer

[11] Patent Number: 5,959,244
[45] Date of Patent: Sep. 28, 1999

[54] FRONT AND REAR CONTACTING EMI GASKET

[75] Inventor: David Mayer, Fort Collins, Colo.

[73] Assignee: Hewlett-Packard Company, Palo Alto, Calif.

[21] Appl. No.: 08/924,713

[22] Filed: Aug. 29, 1997

[51] Int. Cl.[6] .................................................... H05K 9/00
[52] U.S. Cl. .................................. 174/35 GC; 439/609; 439/108
[58] Field of Search .................... 277/920; 174/35 GC, 174/35 R; 361/816, 818, 800; 439/607, 609, 108

[56] References Cited

U.S. PATENT DOCUMENTS

| | | | |
|---|---|---|---|
| 2,783,295 | 2/1957 | Ewing | 174/35 |
| 4,386,814 | 6/1983 | Asick | 439/607 |
| 4,688,868 | 8/1987 | Noyes | 439/108 |
| 4,767,345 | 8/1988 | Gutter et al. | 439/92 |
| 5,204,496 | 4/1993 | Boulay et al. | 174/35 |
| 5,250,751 | 10/1993 | Yamaguchi | 174/35 GC |
| 5,251,109 | 10/1993 | Baitz | 361/796 |
| 5,317,105 | 5/1994 | Weber | 174/35 |
| 5,679,923 | 10/1997 | Le | 174/35 R |

*Primary Examiner*—Kristine Kincaid
*Assistant Examiner*—Hung V Ngo
*Attorney, Agent, or Firm*—Kevin M. Hart

[57] ABSTRACT

An EMI gasket formed from a conductive sheet having a hole therein. A first set of conductive fingers is disposed along the periphery of the hole protruding away from the conductive sheet on the front side. A second set of conductive fingers is disposed along the periphery of the hole protruding away from the conductive sheet on the back side. The first conductive fingers are alternately interleaved with the second conductive fingers. Each of the first conductive fingers includes a first and a second portion defined by a bend. The first portion is disposed in the plane of the sheet. The second portion is disposed in a plane orthogonal to the plane of the sheet. The first conductive fingers operate to engage a conductive portion of a panel. The second conductive fingers operate to engage a conductive portion of a component. The conductive sheet and the first and second sets of conductive fingers are made of spring steel. A third set of conductive fingers similar to the first fingers may be included, disposed on the outer periphery of the conductive sheet. In an electronic component assembly having EMI reduction properties, the EMI gasket is interposed between the component and the conductive exterior panel. An intermediate panel may be interposed between the gasket and the exterior panel. Holes in the intermediate panel allow the first conductive fingers to engage the exterior panel.

8 Claims, 4 Drawing Sheets

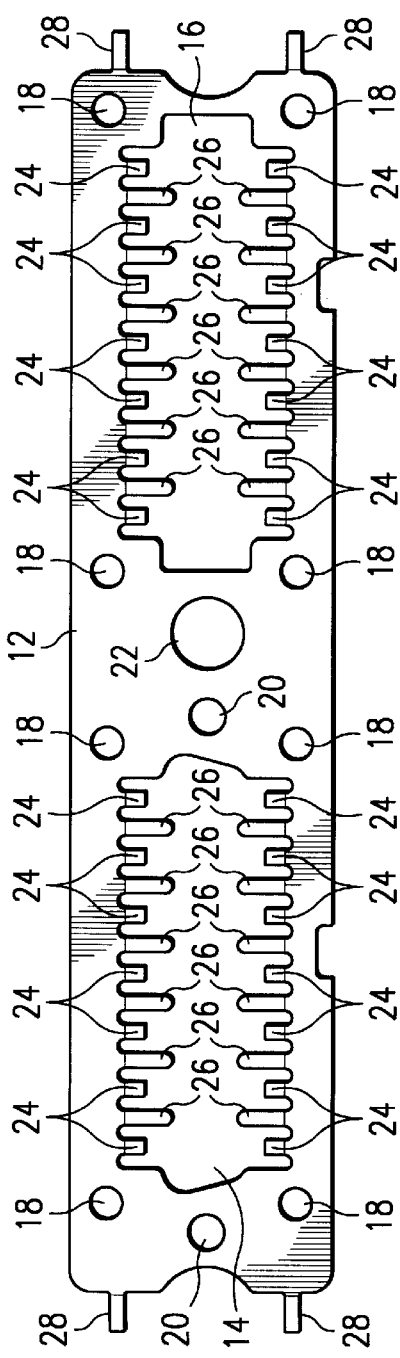
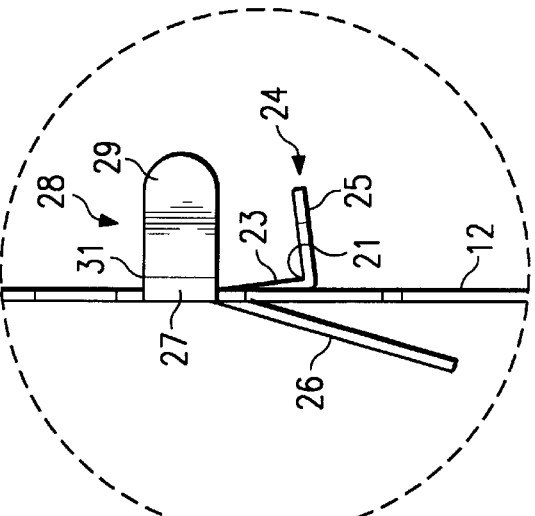
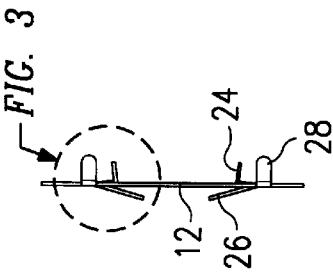

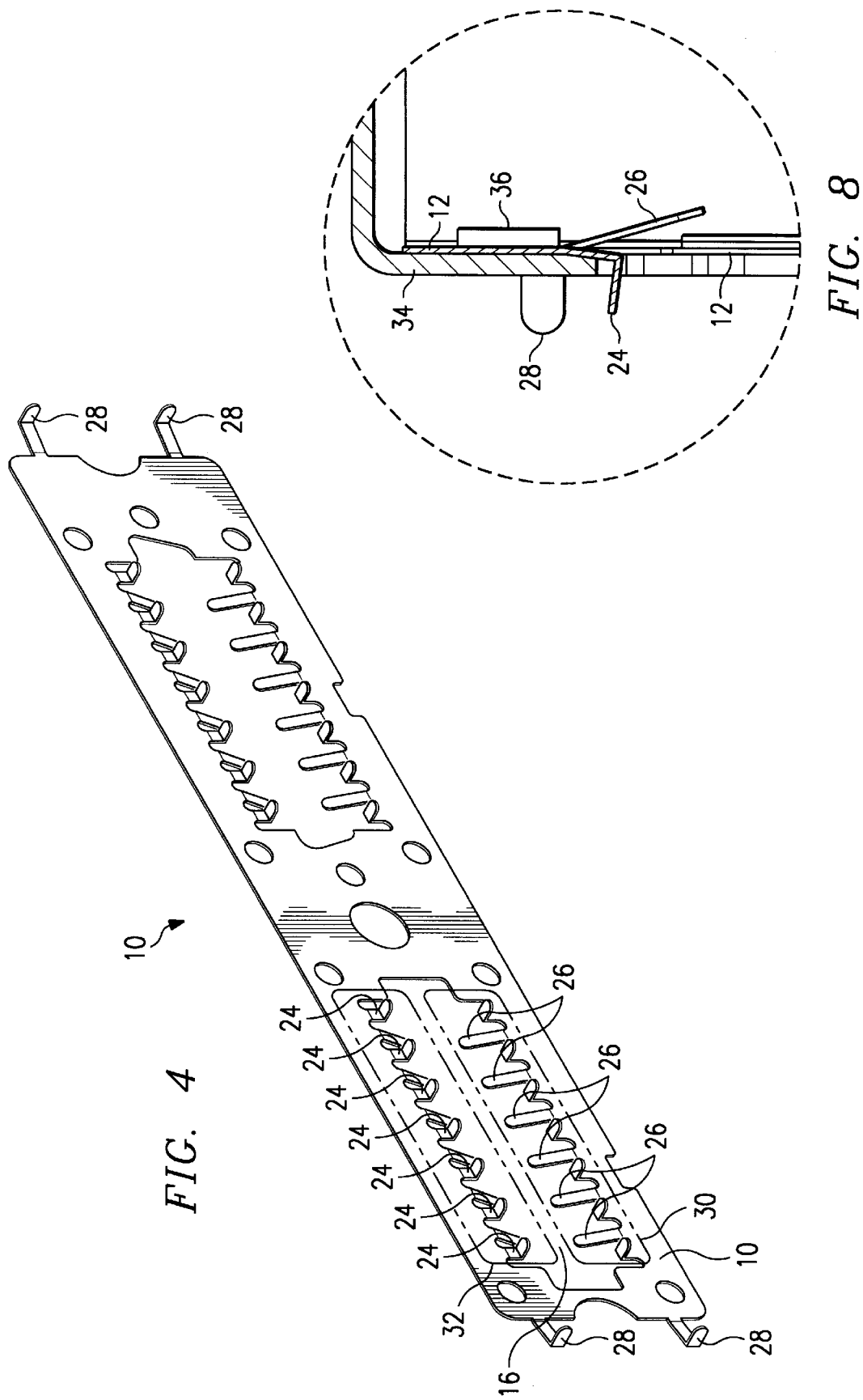

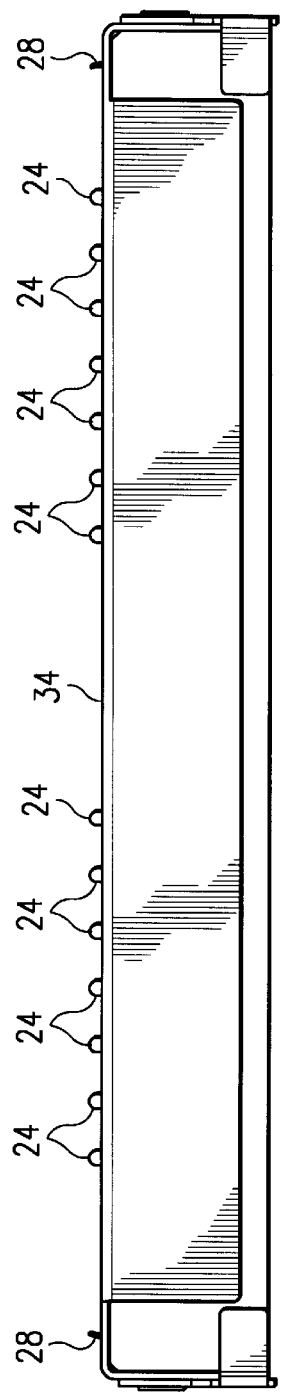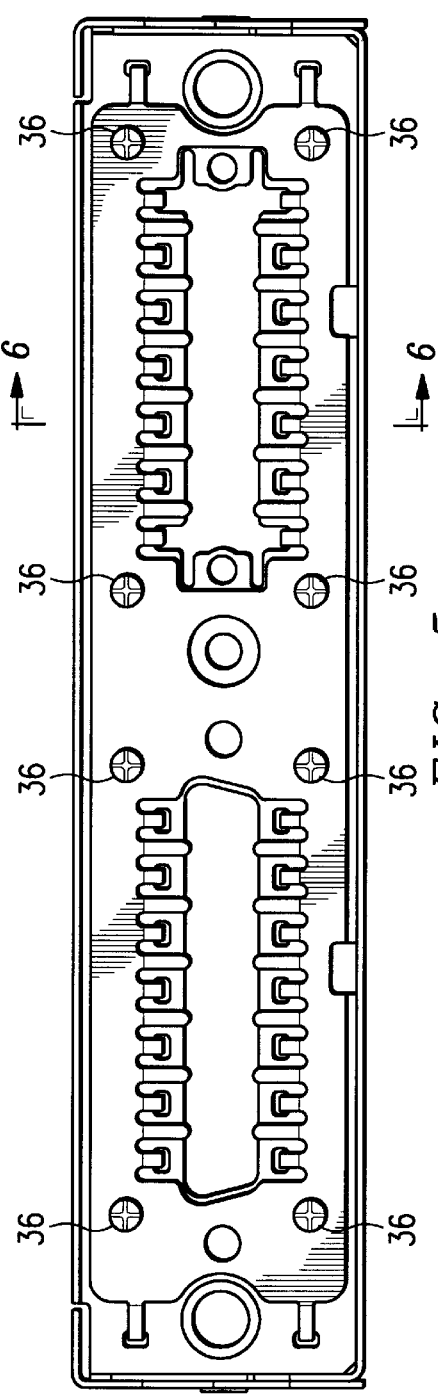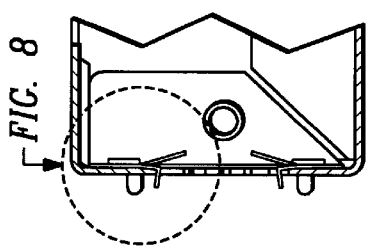

FRONT AND REAR CONTACTING EMI GASKET

FIELD OF THE INVENTION

This invention relates generally to methods and apparatus for the reduction of electromagnetic interference ("EMI") generated by electronic devices. More particularly, the invention relates to gaskets for reducing or preventing the propagation of radiated electromagnetic energy through a joint between a component and a panel or the like.

BACKGROUND

As electronic technology advances, digital systems are being produced that operate at higher and higher clock frequencies. In addition, more circuitry and components are being integrated into smaller volumes. While these advances are beneficial because of the product features they make possible, high-frequency switching usually causes unwanted radiation of electromagnetic energy. This results in EMI. Most countries strictly regulate the amount of EMI that a given electronic device is allowed to generate. Therefore, new and better methods for reducing EMI produced by electronic devices are always desirable.

A particular point of concern in the reduction of EMI caused by such devices is EMI leakage at joints and at openings in the device enclosure. For example, EMI has been found to leak through areas in the enclosure where components such as connectors are mounted for external access. Consequently, various EMI gaskets have been designed for reducing EMI leakage around connectors that are mounted in an opening in a device enclosure.

One such EMI gasket is disclosed in U.S. Pat. No. 5,317,105, issued to William F. Weber May 31, 1994, and assigned to Alcatel Network Systems, Inc. (hereinafter "Weber"). Weber discloses a gasket formed from a conductive gasket plate having a central slot large enough to allow a connector receptacle to pass through it. Deflected teeth, formed from the gasket plate material on two edges of the slot, protrude away from the plane of the gasket plate on one side of the gasket plate and engage a connector inserted into the connector receptacle.

Another EMI gasket is disclosed in U.S. Pat. No. 5,204,496, issued to Steven G. Boulay, et al. Apr. 20, 1993, and assigned to Digital Equipment Corporation (hereinafter "Boulay"). Like Weber, Boulay discloses using a conductive gasket plate having a central slot therein. Unlike the Weber gasket, however, the Boulay gasket does not have teeth on two edges of the slot. Instead, Boulay discloses a series of "turned-out" corners disposed along two of the outside edges of the gasket plate. The turned-out corners all protrude away from the plane of the gasket plate on one side of the gasket plate and engage a circuit card face plate on the inside of the device enclosure. Two u-shaped mounting channels are formed from the gasket material on the side of the gasket opposite the turned-out corners. The mounting channels secure the EMI gasket to the device enclosure by engaging opposing edges of a hole in the enclosure.

While these EMI gasket designs provide some reduction of EMI leakage for particular component arrangements and device enclosures, it is an object of the present invention to provide an improved EMI gasket and component arrangement having enhanced EMI leakage reduction characteristics.

SUMMARY OF THE INVENTION

In an embodiment, the invention includes an EMI gasket formed from a conductive sheet having a hole therein. The conductive sheet has a front side and a back side. A first set of conductive fingers is disposed around the edge of the hole protruding away from the conductive sheet on the front side. A second set of conductive fingers is disposed around the edge of the hole protruding away from the conductive sheet on the back side. The hole may be elongate and may have first and second opposing elongate sides. In such an embodiment, the first set of conductive fingers is disposed along the first and second elongate sides of the elongate hole, and the second set of conductive fingers is also disposed along the first and second elongate sides of the elongate hole. Preferably, the first conductive fingers are alternately interleaved with the second conductive fingers. Each of the first conductive fingers may include a first and a second portion defined by a bend. The first portion is disposed approximately in the plane of the conductive sheet, and the second portion is disposed in a plane that is approximately orthogonal to the plane of the conductive sheet. The first conductive fingers are operable to engage a conductive portion of a panel, and the second conductive fingers are operable to engage a conductive portion of a component, such as a connector. Preferably, the conductive sheet and the first and second sets of conductive fingers are made of spring steel.

In a further embodiment, the gasket includes a third set of conductive fingers disposed on the outer periphery of the conductive sheet. Each of the third conductive fingers may also include a first and a second portion defined by a bend, similar to the first conductive fingers described above.

In yet a further embodiment, the invention includes an electronic component assembly having EMI reduction properties. The just-described EMI gasket is interposed between a component and a conductive exterior panel. The first conductive fingers engage the component, and the second conductive fingers engage the conductive exterior panel. An intermediate panel may be interposed between the gasket and the exterior panel. Holes in the intermediate panel allow the first conductive fingers to pass through the intermediate panel for engagement with the exterior panel.

BRIEF DESCRIPTION OF THE DRAWINGS

The present invention is described herein with reference to the accompanying drawings. Like reference numbers are used in the drawings to indicate identical or functionally similar elements.

FIG. 1 is an orthogonal back view of an EMI gasket according to a preferred embodiment of the invention.

FIG. 2 is an orthogonal side view of the EMI gasket of FIG. 1.

FIG. 3 is an enlarged view of the portion of FIG. 2 labeled "3."

FIG. 4 is an oblique front view of the EMI gasket of FIG. 1.

FIG. 5 is an orthogonal back view showing the EMI gasket of FIG. 1 fastened to a panel.

FIG. 6 is a cross-sectional view taken across the section labeled "6—6" in FIG. 5.

FIG. 7 is an orthogonal top view of the panel and gasket assembly of FIG. 5.

FIG. 8 is an enlarged view of the portion of FIG. 6 labeled "8."

DETAILED DESCRIPTION OF THE PREFERRED EMBODIMENTS

Figure 9:
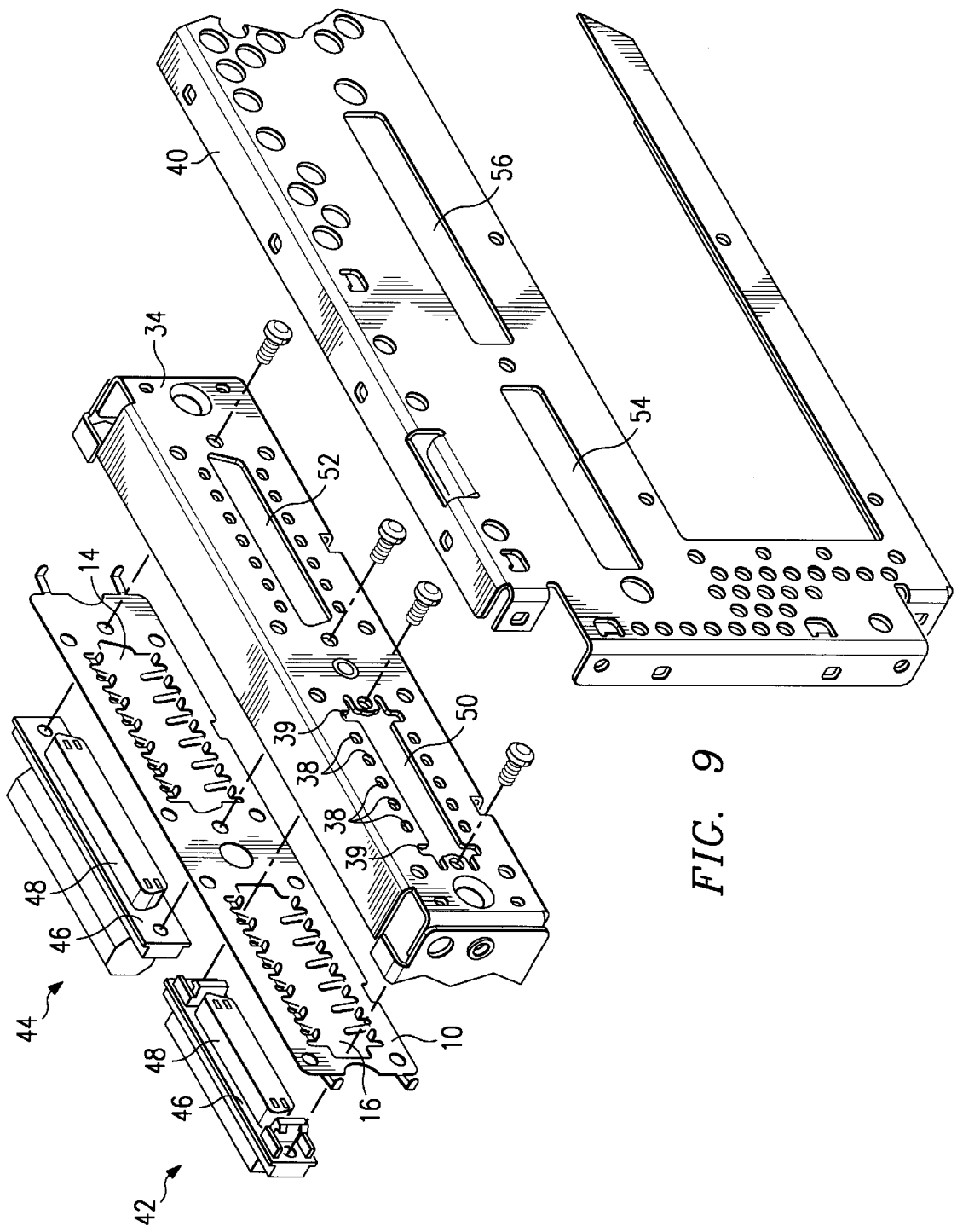
FIG. 9 is an exploded oblique view of an electronic component assembly according to a preferred embodiment of the invention including the EMI gasket of FIG. 1.

An EMI gasket 10 according to a preferred embodiment of the invention is depicted in FIGS. 1–4. FIG. 1 is an orthogonal view of the back side (the "component side") of EMI gasket 10. FIG. 2 is a side orthogonal view of EMI gasket 10. FIG. 3 is an enlarged view of the portion of FIG. 2 labeled "3." And FIG. 4 is an oblique view of the front side (the "panel side") of EMI gasket 10. Conductive sheet 12 is preferably made of a resilient material such as spring steel. Although EMI gasket 10 shown in the drawings contains holes for two different types of connectors, it will be apparent to those having skill in the art that the gasket can be made with one component hole, two component holes or more. Elongate hole 14 is shaped and sized so as to allow the extender portion 48 of connector 44 to pass through it. Elongate hole 16 is shaped and sized so as to allow extender portion 48 of connector 42 to pass through it. Both elongate holes have first and second opposing elongate sides, as indicated generally at 30 and 32. The back side (depicted in FIG. 1) of conductive sheet 12 is intended to face the component, while the front side (depicted in FIG. 4) is intended to face a mounting or enclosure panel such as intermediate panel 34 or exterior panel 40.

Disposed along the elongate sides 30, 32 of elongate holes 14, 16 are two different sets of conductive fingers 24, 26. The first set of conductive fingers 24 protrudes away from the plane of conductive sheet 12 on the front side, while the second set of conductive fingers 26 protrudes away from the plane of conductive sheet 12 on the back side. In a preferred embodiment, the fingers are alternately interleaved, as shown, so that each successive finger protrudes in an opposite direction from the previous finger. Preferably, the fingers are made when stamping holes 14, 16 into conductive sheet 12. (Thus, fingers 24, 26 may be formed from the same material as conductive sheet 12.) Then, the fingers may be bent into their desired positions and shapes.

Enhanced EMI characteristics are achieved when fingers 24 each have a bend 21, as shown. Bend 21 defines a first portion 23 of finger 24 and a second portion 25 of finger 24. Portion 23 lies approximately in the plane of conductive sheet 12, but may be bent slightly toward the front side, as shown. Portion 25 lies in a plane approximately orthogonal to the plane of conductive sheet 12, preferably at approximately ninety degrees from portion 23.

In a further embodiment, enhanced EMI characteristics may be achieved by adding a third set of conductive fingers 28 to the gasket. Fingers 28 are disposed on the outer periphery of conductive sheet 12, as shown. Preferably, fingers 28 protrude toward the font side. In addition, fingers 28 may be bent in the same manner as are fingers 24. (Bend 31 in fingers 28 defines a first portion 27 and a second portion 29. First portion 27 lies approximately in the plane of conductive sheet 12, while second portion 29 lies in a plane approximately orthogonal to the plane of conductive sheet 12.)

Mounting holes 18 are provided for fastening EMI gasket 10 to intermediate panel 34 or panel 40 with fasteners such as rivets 36. Component mounting holes 20 and 22 are provided to allow clearance for fasteners associated with connectors 42, 44. Optionally, component holes 20 and 22 may also engage bosses on intermediate panel 34 or panel 40 to facilitate proper positioning of EMI gasket 10.

Gasket 10 has improved EMI suppression characteristics in part because fingers 24, 26, 28 protrude on opposite sides of conductive sheet 12, in part because fingers 24, 26 are interleaved, and in part because of the unique shapes of fingers 24, 26, 28. In addition, gasket 10 provides improved ease of installation and use because all of the just-mentioned elements are formed as a unitary piece. Gasket 10 may be used beneficially with minor modifications in a variety of installation positions and applications, as will be apparent to those having skill in the art. One such application is to use gasket 10 for reducing the propagation of radiated electromagnetic energy through an interface between a component and a panel as shown in FIGS. 7–9.

In the representative embodiment shown in FIGS. 7–9, intermediate panel 34 may be part of a housing for a subsystem to be mounted within a computer enclosure. For example, intermediate panel 34 may be part of a housing for a peripheral to which connectors must be attached through an exterior panel such as panel 40. In the embodiment shown, connectors 42, 44 each have a conductive shoulder portion 46 and an extender portion 48. When the assembly shown is complete, extender portion 48 will typically extend at least partially through elongate holes 14, 16, holes 50, 52 and holes 54, 56. Elongate holes 14, 16 should be sized large enough to allow extender portions 48 to pass through the holes, but small enough so that fingers 26 are able to engage connectors 42, 44 by pressing against conductive shoulder portion 46. In this manner, a conductive seal is formed around connectors 42, 44 along the periphery of holes 14, 16.

Intermediate panel 34 contains holes 38 sufficiently large to allow portions 25 of fingers 24 to pass through them as shown in FIGS. 7 and 9. Similarly, intermediate panel 34 contains holes 39 to allow portions 29 of fingers 28 to pass through them. In this manner, when intermediate panel is mounted in close proximity to panel 40, fingers 24 and 28 will engage conductive panel 40 by pressing against it, thereby enhancing the EMI seal around the periphery of holes 14, 16, holes 50, 52 and holes 54, 56. In an alternative embodiment, gasket 10 may be used without intermediate panel 34. In such an embodiment, gasket 10 may be mounted directly to exterior panel 40.

While the present invention has been described in detail in relation to various preferred embodiments thereof, it should be understood that the described embodiments have been presented by way of example only, and not by way of limitation. It will be understood by those skilled in the art that various changes may be made in the form and details of the embodiments without departing from the spirit and scope of the invention as defined by the appended claims and their equivalents.

What is claimed is:

1. A gasket for reducing electromagnetic interference, comprising:
    a conductive sheet having a hole formed therein, said conductive sheet having a front side and a back side;
    a first plurality of conductive fingers protruding away from said conductive sheet on said front side; and
    a second plurality of conductive fingers protruding away from said conductive sheet on said back side;
    wherein said hole is elongate and has first and second opposing elongate sides, each of said first and second sides parallel to an axis;
    wherein said first plural conductive fingers are disposed along said first and second elongate sides of said elongate hole;
    wherein said second plural conductive fingers are also disposed along said first and second elongate sides of said elongate hole;
    wherein said first plural conductive fingers are alternately interleaved with said second plural conductive fingers;
    wherein each of said first plural conductive fingers comprises a first and a second portion defined by a bend, said first portion lying approximately in the plane of said conductive sheet, and said second portion lying in a plane that is approximately orthogonal to the plane of said conductive sheet; and wherein said first portion of each of said first plural conductive fingers is oriented substantially orthogonally to said axis of said elongate hole.

2. A gasket for reducing electromagnetic interference, comprising:

a conductive sheet having a hole formed therein, said conductive sheet having a front side and a back side;

a first plurality of conductive fingers disposed around the edge of said hole and protruding away from said conductive sheet on said front side;

a second plurality of conductive fingers disposed around the edge of said hole and protruding away from said conductive sheet on said back side; and a third plurality of conductive fingers disposed on the outer periphery of said conductive sheet;

wherein each of said third plural conductive fingers comprises a first and a second portion defined by a bend, said first portion lying approximately in the plane of said conductive sheet, said second portion lying in a plane that is approximately orthogonal to the plane of said conductive sheet, and said second portion disposed substantially on front side of said conductive sheet.

3. A gasket for reducing the propagation of radiated electromagnetic energy through an interface between a component and a panel, said gasket comprising:

a conductive sheet having an elongate hole formed therein and having a component side and a panel side, said elongate hole having an axis; and first and second pluralities of conductive fingers disposed around the periphery of said elongate hole;

wherein said first plural conductive fingers protrude away from said conductive sheet on said panel side and said second plural conductive fingers protrude away from said conductive sheet on said component side;

wherein said first plural conductive fingers are alternately interleaved with said second plural conductive fingers;

wherein each of said first plural conductive fingers comprises a first and a second portion defined by a bend, said first portion lying approximately in the plane of said conductive sheet, and said second portion lying in a plane that is approximately orthogonal to the plane of said conductive sheet; and wherein said first portion of each of said first plural conductive fingers is oriented substantially orthogonally to said axis of said elongate hole.

4. A gasket for reducing the propagation of radiated electromagnetic energy through an interface between a component and a panel, said gasket comprising:

a conductive sheet having a hole formed therein and having a component side and a panel side;

first and second pluralities of conductive fingers disposed around the periphery of said hole;

wherein said first plural conductive fingers protrude away from said conductive sheet on said panel side and said second plural conductive fingers protrude away from said conductive sheet on said component side, said first plural conductive fingers operable to engage a conductive portion of said panel, and said second plural conductive fingers operable to engage a conductive portion of said component; and a third plurality of conductive fingers disposed around the outer periphery of said conductive sheet;

wherein each of said third plural conductive fingers comprises a first and a second portion defined by a bend, said first portion lying approximately in the plane of said conductive sheet, said second portion lying in a plane that is approximately orthogonal to the plane of said conductive sheet, and said second portion disposed substantially on said panel side of said conductive sheet.

5. An electronic component assembly having electromagnetic interference reduction properties, said assembly comprising:

a component having a conductive shoulder portion and an extender portion;

a conductive exterior panel;

an electromagnetic interference reducing gasket interposed between said component and said conductive exterior panel, said electromagnetic interference reducing gasket comprising:

a conductive sheet having a hole formed therein and having a component side and a panel side; and first and second pluralities of conductive fingers disposed around the periphery of said hole;

wherein said first plural conductive fingers protrude away from said conductive sheet on said panel side and said second plural conductive fingers protrude away from said conductive sheet on said component side;

said extender portion of said component protruding through said hole and at least partially through said conductive exterior panel, said first plural conductive fingers engaging said conductive exterior panel, and said second plural conductive fingers engaging said conductive shoulder portion of said component; and an intermediate panel interposed between said electromagnetic interference reducing gasket and said conductive exterior panel, said intermediate panel having an intermediate hole through which said extender portion of said component passes, and having a plurality of finger holes disposed around the periphery of said intermediate hole, said first plural conductive fingers passing through said plural finger holes.

6. The electronic component assembly according to claim 5, wherein said intermediate panel comprises a portion of a housing for an electronic device, and wherein said exterior panel comprises a portion of an enclosure for an electronic system that includes said electronic device.

7. An electronic component assembly having electromagnetic interference reduction properties, said assembly comprising:

a component having a conductive shoulder portion and an extender portion;

a conductive exterior panel; and an electromagnetic interference reducing gasket interposed between said component and said conductive exterior panel, said electromagnetic interference reducing gasket comprising:

a conductive sheet having a hole formed therein and having a component side and a panel side; and first and second pluralities of conductive fingers disposed around the periphery of said hole;

wherein said first plural conductive fingers protrude away from said conductive sheet on said panel side and said second plural conductive fingers protrude away from said conductive sheet on said component side;

said extender portion of said component protruding through said hole and at least partially through said conductive exterior panel, said first plural conductive fingers engaging said conductive exterior panel, and said second plural conductive fingers engaging said conductive shoulder portion of said component;

wherein each of said first plural conductive fingers comprises a first and a second portion defined by a bend, said first portion lying approximately in the plane of said conductive sheet, and said second portion lying in a plane that is approximately orthogonal to the plane of said conductive sheet.

8. An electronic component assembly having electromagnetic interference reduction properties, said assembly comprising:

a component having a conductive shoulder portion and an extender portion;

a conductive exterior panel;

an electromagnetic interference reducing gasket interposed between said component and said conductive exterior panel, said electromagnetic interference reducing gasket comprising:

a conductive sheet having a hole formed therein and having a component side and a panel side; and first and second pluralities of conductive fingers disposed around the periphery of said hole;

wherein said first plural conductive fingers protrude away from said conductive sheet on said panel side and said second plural conductive fingers protrude away from said conductive sheet on said component side;

said extender portion of said component protruding through said hole and at least partially through said conductive exterior panel, said first plural conductive fingers engaging said conductive exterior panel, and said second plural conductive fingers engaging said conductive shoulder portion of said component; and a third plurality of conductive fingers disposed around the outer periphery of said conductive sheet;

wherein each of said third plural conductive fingers comprises a first and a second portion defined by a bend, said first portion lying approximately in the plane of said conductive sheet, said second portion lying in a plane that is approximately orthogonal to the plane of said conductive sheet, and said second portion disposed substantially on said panel side of said conductive sheet.

* * * * *